United States Patent [19]

Huguenin et al.

[11] 4,063,910
[45] Dec. 20, 1977

[54] APPARATUS FOR AUTOMATICALLY ADJUSTING THE FREQUENCY OF PIEZOELECTRIC RESONATORS IN THE FORM OF BARS OR PLATES

[75] Inventors: Raymond Huguenin, Port; Hubert Matthey, Brugg; Martial Voumard, Bienne, all of Switzerland

[73] Assignee: Societe Suisse pour l'Industrie Horlogere Management Services S.A., Bienne, Switzerland

[21] Appl. No.: 778,818

[22] Filed: Mar. 17, 1977

Related U.S. Application Data

[62] Division of Ser. No. 721,724, Sept. 9, 1976.

[30] Foreign Application Priority Data

Sept. 12, 1975 Switzerland ............... 11889/75

[51] Int. Cl.² .................. B24B 49/00; B24C 3/32
[52] U.S. Cl. ........................... 51/413; 51/165 R
[58] Field of Search ............... 51/165 R, 413, 319, 51/421; 29/25.35, 593; 219/121 L, 121 LM

[56] References Cited

U.S. PATENT DOCUMENTS

| 3,453,781 | 7/1969 | Greenman | 51/319 X |
| 3,589,081 | 6/1971 | Kilischenko | 51/319 |
| 3,665,570 | 5/1972 | Brooks | 51/319 X |
| 3,691,695 | 9/1972 | Green | 51/165 R X |
| 3,702,042 | 11/1972 | Cochran | 51/165 R X |
| 3,808,752 | 5/1974 | Beaver | 51/319 |
| 3,829,962 | 8/1974 | Simonelic | 29/593 |

Primary Examiner—Harold D. Whitehead
Assistant Examiner—Nicholas P. Godici
Attorney, Agent, or Firm—Griffin, Branigan and Butler

[57] ABSTRACT

Apparatus for automatically adjusting the frequency of a piezoelectric resonator in the form of a bar or plate includes circuitry for applying a voltage to the resonator to cause it to resonate, measuring the frequency of the resonator continuously during a frequency adjusting cycle, continuously comparing the measured frequency with a desired frequency to obtain a difference frequency value, storing the difference frequency value at the beginning of the adjusting cycle, deriving from the difference frequency value a threshold value equal to one-half of the difference frequency value, comparing the threshold value with the frequency difference value, removing material by a sand blast from a first extremity of the resonator as long as the difference frequency value is greater than the threshold value and thereafter removing material from the other extremity of the resonator until the difference frequency value is nil.

7 Claims, 2 Drawing Figures

APPARATUS FOR AUTOMATICALLY ADJUSTING THE FREQUENCY OF PIEZOELECTRIC RESONATORS IN THE FORM OF BARS OR PLATES

This is a division of application Ser. No. 721,724 filed Sept. 9, 1976.

The machining tolerances of the bar or the plate as well as the influence of the suspending members do not in general enable one to obtain the desired frequency to the precision required without proceeding to make many readjustments.

In the case of all resonators frequency varies as the inverse of at least one of these dimensions.

The classical method of making a piezoelectric resonator comprises machining the resonator with the determining dimension oversize this giving the resonator a lower frequency than that desired. Then during the last stage of the process the excess material is removed by means of a grinder, a sand-blast (U.S. Pat. No. 3,808,752) or a laser beam for example. Successive adjustments are followed by measurement of the frequency until the latter is brought to the desired value.

In the case of bars operating in the longitudinal mode or in the bending mode one acts preferably on the longitudinal dimension.

The performances of the resonators depend on the care applied in the fixing of the bar or plate to its support by means of the suspension elements.

In particular, the symmetry of the position of the suspension points, (nodal points), relative to the center of the bar or the plate play a dominant role. Such symmetry ought to be maintained for the resonator which as been given its definite dimensions which is to say following the frequency adjustment.

Generally if the initial mounting has been made taking care to respect symmetry this will be considerably altered during frequency adjustment.

The finished resonators show in such case an important dispersion of the quality factor as well as anomalies in the frequency as a function of temperature, in view of the fact that a certain energy will be transmitted outside the resonator.

An object of the present invention is to provide apparatus for adjusting the frequency of piezoelectric resonators having the form of bars or plates by sand-blasting a determined dimension such as the length while assuring the maintenance of the symmetry of the support points relative to the center of the bar or the plate.

Such purpose is attained by a sand-blast affecting each extremtiy of the resonator to a degree such that it corresponds to a correction of frequency equal to the half of the frequency difference to be corrected.

An object of the present invention is to provide an apparatus for automatically adjusting the frequency of a piezoelectric resonator in the form of a bar or plate, the apparatus comprising means for applying a voltage to the resonator to cause it to resonate, means for measuring the frequency of the resonator continuously during a frequency adjusting cycle, means for continuously comparing the measured frequency with a desired frequency to obtain a difference frequency value, means storing the difference frequency value at the beginning of an adjusting cycle, means deriving from the difference frequency value a threshold value equal to one-half of the difference value, means comparing the threshold value with the difference frequency value, means removing material from a first extremity of the resonator as long as the difference frequency value is greater than the threshold value, and removing material from a second extremity of the resonator after removal of material from the first extremity is terminated, removal of material from the second extremity continuing until the difference frequency value is nil.

A further object of the invention is to provide an apparatus as set forth above wherein removal of material from the resonator is accomplished by directing jets of abrasive material toward the first and second extremities of the resonator from first and second nozzles.

A further object of the invention is to provide an apparatus as defined above and including means rotating the resonator after removal of material from the first extremity is terminated and before removal of material from the second extremity is begun.

For a better understanding of the invention reference will be made to the following description having respect to the drawings of which:

Figure 1:
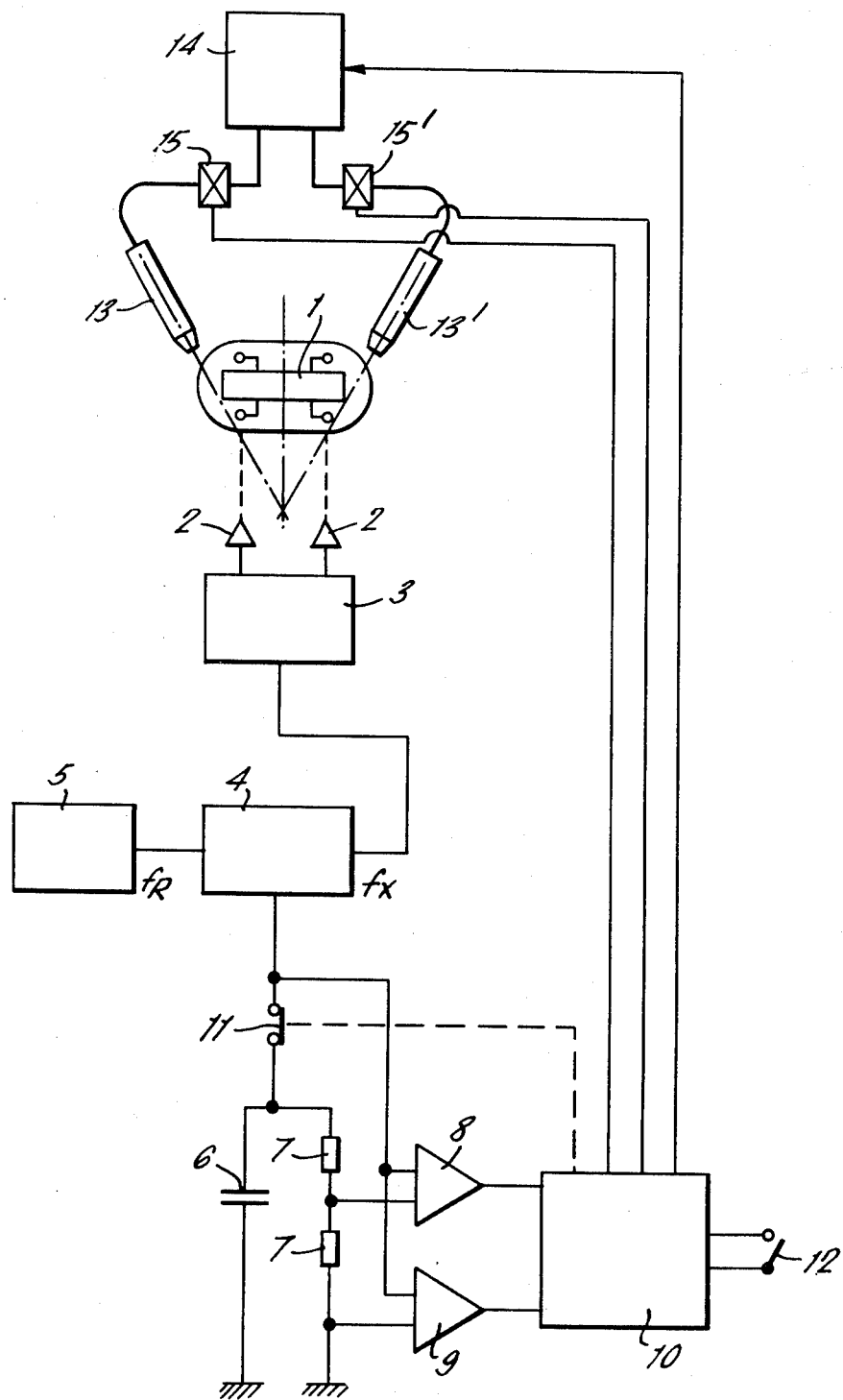
FIG. 1 is a block diagram showing the principle of the invention.

The process and apparatus according to the invention are shown in FIG. 1 elements wherein a resonator 1 is mounted on a support 18 by suspension elements 20. The suspension elements 20 are symmetrically located relative to the center line of the resonator 1.

A measuring circuit comprises a fixed support provided with electrical contacts 2 for the resonator, an electronic circuit 3 capable of maintaining the resonator in oscillation at its permanent resonant frequency, a frequency comparator 4 measuring the difference between the frequency of the resonator $f_x$ and the desired frequency $f_R$, and a generator 5 delivering a signal at this desired frequency $f_R$. Comparator 4 gives the value of the difference $f_R - f_x = \Delta f$ in the form of a continuous current which is proportional thereto.

A control circuit is provided comprising a capacitor 6 serving as a memory, across which is coupled a voltage divider having tow resistors 7 from which two voltage comparators compare voltage proportional to $\Delta f$, one 8 with the output of the divider, the other 9 with a zero voltage. The outputs of the two voltage comparators act on a logic block 10 which controls the sand-blast system as well as switch 11 which disconnects the capacitor serving as memory. A contact 12 which may be manually actuated starts the working cycle.

A sand-blast arrangement is provided in the form of two fixed sanding nozzles 13, 13', arranged symmetrically relative to the center of the resonator on either end of the length to be reduced. A feed apparatus 14 supplies the sand blast material to the nozzles and each nozzle is provided with its own control vane 15, 15'.

The running of the cycle is described hereinafter. At rest the blasting device is inactive. The resonator 1 on its support oscillates at its unadjusted frequency $f_x$ lower than the desired value $f_R$. The frequency comparator 4 supplied a voltage proportional to the difference $\Delta f = f_R - f_x$ which voltage is transmitted to memory 6 by the closed switch 11. This voltage represents the entire correction which will be necessary. The voltage divider 7 comprising the two approximately equal resistors transmits to the voltage comparator half of this voltage representing half of the necessary correction. In some cases a different proportion from half may be chosen.

Switch 12 connected to the logic block 10 is closed to control the beginning of the adjustment cycle. This opens contact 11 thereby disconnecting the frequency comparator 4 from capacitor 6 which will conserve its charge until the end of the cycle. It is understood that voltage divider 7 has a current consumption sufficiently low such that the capacitor 6 may guard its charge during the cycle. Simultaneously the abrasive distributor 14 is connected with a single one of the nozzles 13 by the corresponding vane 15.

The adjustment is effected at one extremity of the length to be corrected on the bar or the plate, for which the frequency measured during the operation will increase, thereby diminishing the difference $\Delta f$ relative to the desired frequency.

As soon as half the correction necessary is attained the comparator 8 will react thereby affecting the logic block 10 which will interrupt the action of the first nozzle 15 and commence action of the second nozzle 15'. The adjustment at this point is transferred to the other extremity of the bar or plate until $\Delta f = 0$ at which point the voltage comparator 9 reacts in its turn and determines the end of the cycle, bringing the installation back to its initial state of rest.

At the end of the cycle the resonator is at the exact frequency and moreover will have its original symmetry, the same quantity of material having been taken away from each extremity.

Figure 2:
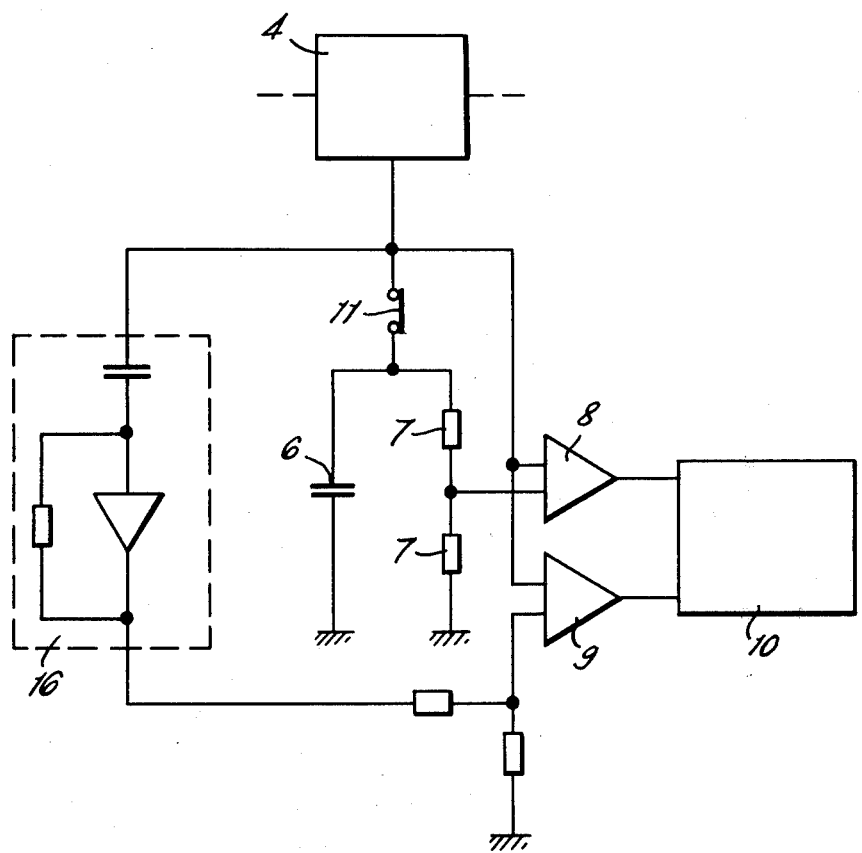
FIG. 2 shows a detail of the preferred form of the invention.

The measurement of $\Delta f$ continues throughout the correction and the frequency comparator 4 must have for a characteristic a short reaction time in order to avoid the risk of exceeding the frequency. Moreover, the reaction time of elements such as the control vanes is not zero taking into account the speed of abrasion. This may be compensated for by modifying the threshold of the voltage comparator 9 which is responsible for stopping the apparatus, by a correction voltage proportional to the speed of abrasion. This is obtained by differentiating relative to time the voltage proportional to $\Delta f$ supplied by the frequency comparator 4 with a differentiating circuit 16 such as that illustrated in FIG. 2.

A variant of the system consists of utilizing only a single nozzle. The resonator support must then be arranged to permit the rotation thereof by half a turn brought about automatically by the logic block at the moment when half the correction has been attained.

What we claim is:

1. Apparatus for automatically adjusting the frequency of a piezoelectric resonator in the form of a bar or plate, said apparatus comprising:
   means for applying a voltage to said resonator to cause it to resonate;
   means for measuring the frequency of said resonator continuously during a frequency adjusting cycle;
   means for continuously comparing said measured frequency with a desired frequency to obtain a difference frequency value;
   means for storing said difference frequency value at the beginning of an adjusting cycle;
   means for deriving from said difference frequency value a threshold value equal to one half of said difference frequency value;
   means for comparing said threshold value with said difference frequency value; and,
   means responsive to said comparing means for removing material from a first extremity of said resonator as long as said difference frequency value is greater than said threshold value.

2. Apparatus as claimed in claim 1 and further comprising further comparing means for detecting when said difference frequency is nil and circuit means responsive to said comparing means and said further comparing means for controlling said material removing means to remove material from the other extremity when said difference frequency value is less than said threshold value but greater than zero.

3. Apparatus as claimed in claim 2 wherein said means for removing said material from said first and other extremities comprises first and second nozzles directing jets of abrasive material toward said first and said other extremity, respectively.

4. Apparatus as claimed in claim 2 and further including means rotatably supporting said resonator whereby it may be rotated after removal of material from said first extremity is terminated and before removal of material from said other extremity is begun.

5. Apparatus as claimed in claim 4 wherein the means for removing material from said first and other extremities comprises a single nozzle directing a jet of abrasive material toward said first extremity before said resonator is rotated and toward said other extremity after said resonator is rotated.

6. Apparatus as claimed in claim 2 wherein the means for removing said material from said first and other extremities comprises means directing a jet of abrasive material first toward said first extremity and then toward said other extremity.

7. Apparatus as claimed in claim 3 and further comprising means differentiating said frequency difference value with respect to time to develop a compensation signal, and means for applying said compensation signal to said further comparing means to compensate for the reaction time of said means for removing material.

* * * * *